(12) United States Patent
Klochkov et al.

(10) Patent No.: US 12,056,865 B2
(45) Date of Patent: Aug. 6, 2024

(54) WAFER-TILT DETERMINATION FOR SLICE-AND-IMAGE PROCESS

(71) Applicant: Carl Zeiss SMT GmbH, Oberkochen (DE)

(72) Inventors: Dmitry Klochkov, Schwaebisch Gmuend (DE); Chuong Huynh, Quincy, MA (US); Thomas Korb, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 441 days.

(21) Appl. No.: 17/496,345

(22) Filed: Oct. 7, 2021

(65) Prior Publication Data

US 2023/0115376 A1   Apr. 13, 2023

(51) Int. Cl.
*G06T 7/00* (2017.01)
*G05B 15/02* (2006.01)
*G06T 7/13* (2017.01)

(52) U.S. Cl.
CPC ............ *G06T 7/0004* (2013.01); *G05B 15/02* (2013.01); *G06T 7/13* (2017.01); *G06T 2207/10072* (2013.01); *G06T 2207/30148* (2013.01)

(58) Field of Classification Search
CPC ...................... G06T 7/0004; G06T 7/13; G06T 2207/10072; G06T 2207/30148; G05B 15/02; H01J 37/304; H01J 2237/31745; G01N 23/2251
See application file for complete search history.

(56) References Cited

U.S. PATENT DOCUMENTS

| | | | |
|---|---|---|---|
| 10,903,044 B1* | 1/2021 | Litman | H10B 43/27 |
| 2007/0023651 A1 | 2/2007 | Ishitani et al. | |
| 2019/0170509 A1 | 6/2019 | Kawada | |
| 2019/0353566 A1 | 11/2019 | Porter et al. | |
| 2022/0392793 A1* | 12/2022 | Buxbaum | G06T 7/50 |

FOREIGN PATENT DOCUMENTS

| | | |
|---|---|---|
| JP | 2008-70155 A | 3/2008 |
| JP | 2012-22903 A | 2/2012 |
| TW | 1575627 | 3/2017 |
| WO | WO2014/106182 A1 | 7/2014 |
| WO | WO2021/180600 A1 | 9/2020 |
| WO | WO 2021/083581 A1 | 5/2021 |
| WO | WO 2021/180600 A1 | 9/2021 |

OTHER PUBLICATIONS

Taiwanese Notice of Allowance and Search Report, with translation thereof, for corresponding TW Appl No. 111135713, dated Jun. 27, 2023.
U.S. Appl. No. 63/037,847, entitled "Method of cross-section imaging of an inspection vols. in wafer," filed Jun. 11, 2020.
International Search Report and Written Opinion for corresponding PCT Appl No. PCT/EP2022/077713, dated Feb. 23, 2023.

* cited by examiner

*Primary Examiner* — Hwa Andrew Lee
(74) *Attorney, Agent, or Firm* — Fish & Richardson P.C.

(57) ABSTRACT

A dual-beam device, such as, a scanning electron microscope combined with a focused-ion beam milling column, is employed for a slice-in-image process. Based on one or more images of at least one cross-section of a test volume of a wafer, a wafer tilt is determined.

25 Claims, 12 Drawing Sheets

WAFER-TILT DETERMINATION FOR SLICE-AND-IMAGE PROCESS

FIELD

The disclosure relates to operating a dual-beam device configured for implementing a slice-and-image process of a test volume of a wafer. In some embodiments, techniques are disclosed that facilitate determining at least one component of a wafer tilt based on one or more images acquired of the test volume of the wafer using the slice-and-image process.

BACKGROUND

Semiconductor structures are amongst the finest man-made structures and suffer from few imperfections only. These rare imperfections are the signatures which defect detection or defect review or quantitative metrology devices are looking for.

To do so, imaging using a dual-beam device can be employed. Here, images depicting cross-sections of a test volume can be acquired. Tomographic imaging is possible.

SUMMARY

Sometimes the accuracy of images acquired using an imaging column of a dual-beam device (DBD) and depicting a cross-section of a test volume on the wafer can be low. In some cases, semiconductor structures can appear distorted. Accordingly, the imaging process can introduce inaccuracies. This can lead to inaccurate or unreliable defect detection or defect review or quantitative metrology.

It would be desirable to provide improved techniques of defect detection or defect review or quantitative metrology based on tomographic imaging of a test volume of a wafer using a DBD, such as techniques that can overcome or mitigate at least some of the known restrictions or drawbacks.

In an aspect, the disclosure provides a computer-implemented method that includes obtaining one or more images of a test volume on the wafer. The wafer is mounted on a sample stage of a dual-beam device. The one or more images are acquired using an imaging column all of the dual-beam device. The one or more images depict one or more cross-sections of the test volume of the wafer at one or more stage tilts of the sample states. The one or more images are obtained by slanted milling of the wafer using a milling column of the dual-beam device. The method also includes determining at least one component of the wafer tilt of the wafer by taking into account prior knowledge of one or more structures of the wafer and based on the one or more images.

In an aspect, the disclosure provides a computer program or a computer-program product or a computer-readable storage medium that includes program code. The program code can be loaded and executed by at least one processor. Upon loading and executing the program code, the at least one processor performs a method. The method includes obtaining one or more images of a test volume on the wafer. The wafer is mounted on a sample stage of a dual-beam device. The one or more images are acquired using an imaging column all of the dual-beam device. The one or more images depict one or more cross-sections of the test volume of the wafer at one or more stage tilts of the sample states. The one or more images are obtained by slanted milling of the wafer using a milling column of the dual-beam device. The method also includes determining at least one component of the wafer tilt of the wafer by taking into account prior knowledge of one or more structures of the wafer and based on the one or more images.

In an aspect, the disclosure provides a device that includes at least one processor. The at least one processor can load and execute program code. Upon loading and executing the program code, the at least one processor performs a method. The method includes obtaining one or more images of a test volume on the wafer. The wafer is mounted on a sample stage of a dual-beam device. The one or more images are acquired using an imaging column all of the dual-beam device. The one or more images depict one or more cross-sections of the test volume of the wafer at one or more stage tilts of the sample states. The one or more images are obtained by slanted milling of the wafer using a milling column of the dual-beam device. The method also includes determining at least one component of the wafer tilt of the wafer by taking into account prior knowledge of one or more structures of the wafer and based on the one or more images.

In an aspect, the disclosure provides method of using a dual-beam device which comprises an imaging column and a milling column, the method including: using the imaging column to obtain at least one image of a test volume of a wafer mounted on a sample stage of the dual-beam device, the image depicting at least one cross-section of the test volume at at least one stage tilt of the sample stage, the at least one cross-section of the test volume obtained by slanted milling of the wafer using the milling column of the dual-beam device; and determining at least one component of a wafer tilt of the wafer with respect to the sample stage taking into account knowledge of at least one structure of the wafer and the at least one image of the test volume of the wafer. In some cases, the method can be controlled by a computer.

In an aspect, the disclosure provides a method of using a dual-beam device which comprises an imaging column and a milling column, the method including: using the milling column to slant mill a test volume of a wafer to yield a cross-section of the test volume; using the imaging column to obtain an image of the cross-section of the test volume of the wafer; and determining a component of a wafer tilt of the wafer with respect to a sample stage of the dual-beam device taking into account knowledge of a structure of the wafer and the image of the test volume of the wafer. In some cases, the method can be controlled by a computer.

In an aspect, the disclosure provides one or more machine-readable hardware storage devices comprising instructions that are executable by one or more processing devices to perform operations including a method disclosed herein.

In an aspect, the disclosure provides a system including: one or more processing devices; and one or more machine-readable hardware storage devices comprising instructions that are executable by the one or more processing devices to perform operations including a method disclosed herein.

It is to be understood that the features mentioned above and those yet to be explained below may be used not only in the respective combinations indicated, but also in other combinations or in isolation without departing from the scope of the disclosure.

DETAILED DESCRIPTION

Figure 1:
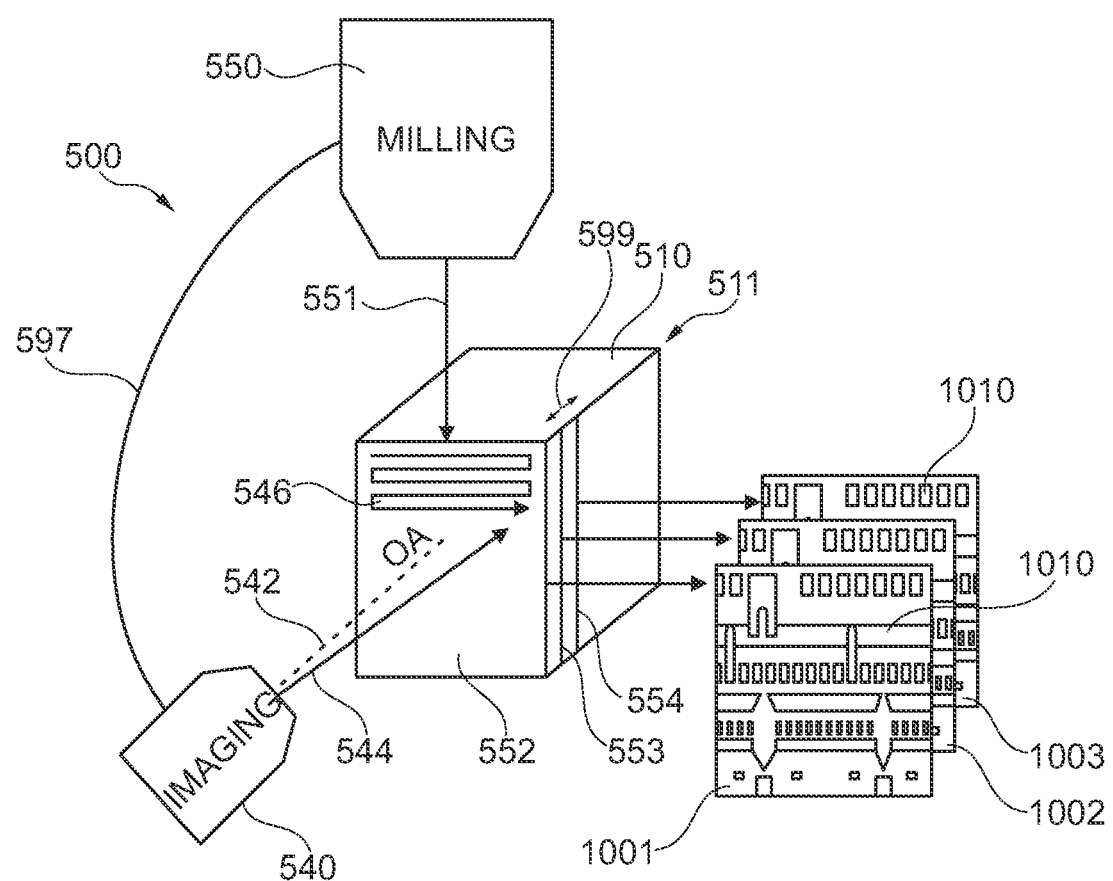
FIG. 1 schematically illustrates a slice-and-image process using a dual-beam device according to various examples.

Some examples of the present disclosure generally provide for a plurality of circuits or other electrical devices. All references to the circuits and other electrical devices and the functionality provided by each are not intended to be limited to encompassing only what is illustrated and described herein. While certain labels may be assigned to the various circuits or other electrical devices disclosed, such labels are not intended to limit the scope of operation for the circuits and the other electrical devices. Such circuits and other electrical devices may be combined with each other and/or separated in any manner based on the type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various techniques disclosed relate to tomographic imaging of semiconductor wafers. For instance, 3-D tomographic data of semiconductor structures on nm scale can be obtained through the so-called slice-and-image process that can be implemented using a DBD. Here, two particle optical systems can be arranged at an angle (column offset angle). The two particle optical systems might be oriented perpendicular or at a column offset angle between 45° and 90°. The first particle optical system defines an imaging column. The imaging column can be implemented by a scanning electron microscope (SEM) or a helium-ion microscope (HIM). The second particle optical system defines a milling column. The milling column can be a focused ion beam (FIB) optical system, using for example Gallium (Ga) ions. The FIB of Ga ions are used to cut off slices of a test volume of the wafer, slice-by-slice. Thereby, images depicting cross-sections of the wafer are obtained at different milling depths, using the imaging column. The relevant background of the DBD and operation of the DBD, including the slice-and-imaging approach will be explained in connection with FIGS. 1 to 4.

FIG. 1 shows a schematic view of the slice-and-image process using a DBD 500: using a milling column 550, with a focused ion beam 551 in z-direction, and scanning in y-z-plane, a thin layer of a cross-section through a test volume 510 of a wafer 511 is removed to reveal a new front cross-section 552 as a cross section of the test volume 510 (after imaging, this can be repeated to reveal further cross-sections 553, 554).

The imaging column 540—e.g., a SEM—is used for scanning imaging of the cross-sections associated with the cross-sections 552, 553, 554.

The column offset angle 597 is 90° in the illustrated example. Other values are possible for the column offset angle 597.

In the illustrated example, the SEM optical axis 542 is shown, and the image is generated by scanning the electron beam 544 along scanning imaging lines 546. After performing the raster scan of the cross-section 552, a two-dimensional (2-D) image 1001 is formed.

By repetition of this milling and imaging, further images 1002 and 1003 are obtained, at different milling depths 599. The images 1001, 1003, 1004 thus correspond to image slices obtained at different milling depths 599 of the test volume 510. The images 1001, 1002, 1003 can be labeled cross-sectional image slices. The depth offset between two subsequent milling depths can be between 1 nm and some tens of nm, for example 30 nm.

From the sequence of these 2-D images 1001-1103, a 3D tomographic image of the test volume, depicting the semiconductor structures 1010 can be reconstructed.

In general, various kinds and types of semiconductor structures can be imaged. For instance, a three-dimensional (3-D) memory chips could be imaged, e.g., VNAND or 3-D Ram. 3D memory chips (VNAND or 3D RAM) are composed of many pillar-like structures running parallel to each other and sometimes referred to as memory channels or "pillars" as shown in FIG. 2.

Figure 2:
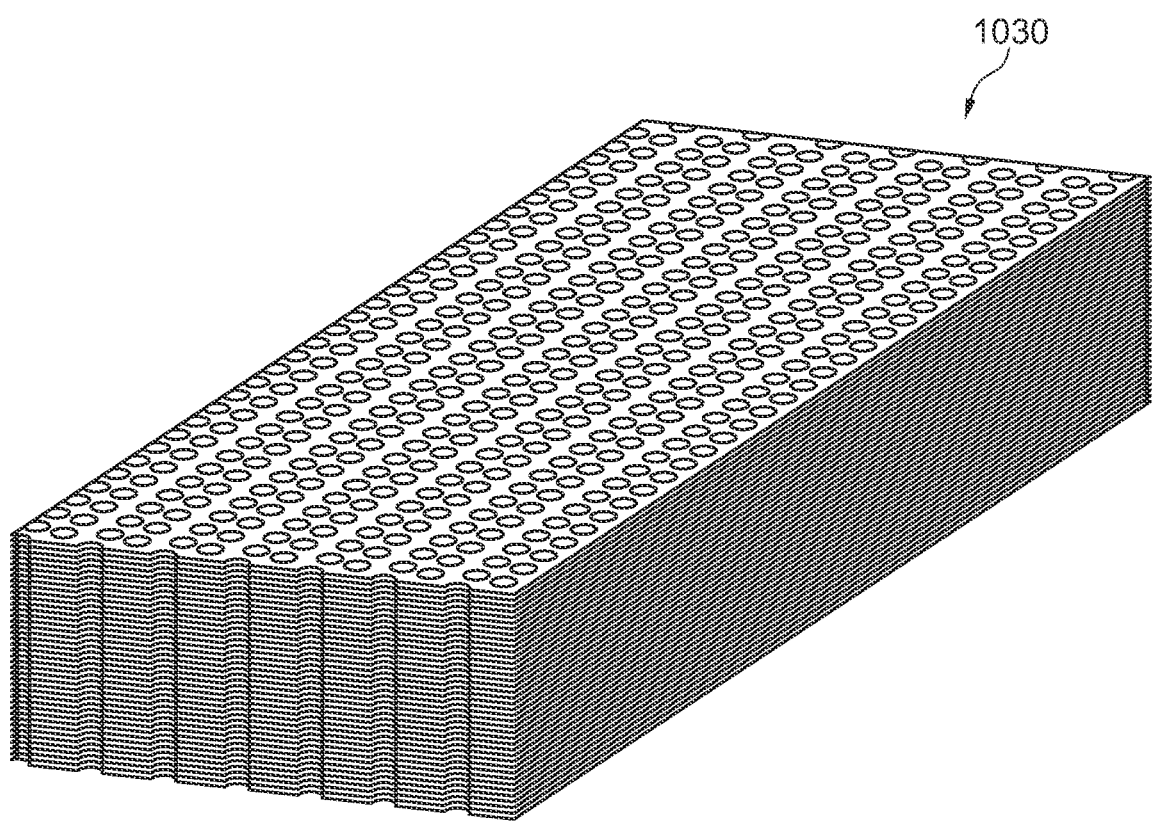
FIG. 2 is a 3D tomography image reconstruction for multiple 2D images obtained using the slides-and-image process according to the example of FIG. 1.

FIG. 2 schematically illustrates a 3-D tomographic image 1030 reconstructed from multiple 2-D images. The 3-D tomographic image 1030 depicts a 3-D memory device. The 3-D tomographic image 1030 has been acquired using a DBD such as a FIB-SEM DBD or a FIB-HIM DBD, and using a slice-and-image process, as explained in connection with FIG. 1.

If the milling column is arranged such that the slices are oriented perpendicular to the pillar/channel axes of the 3-D memory device, the slices will contain footprints of the pillars which usually have a circular shape and form a hexagonal grid. The slices can be "photographed" using the imaging column.

In other scenarios, it is possible that the optical axis 542 of the imaging column 540 is not oriented perpendicular to the imaged cross-sections. Such scenario is shown in FIG. 3.

Figure 3:
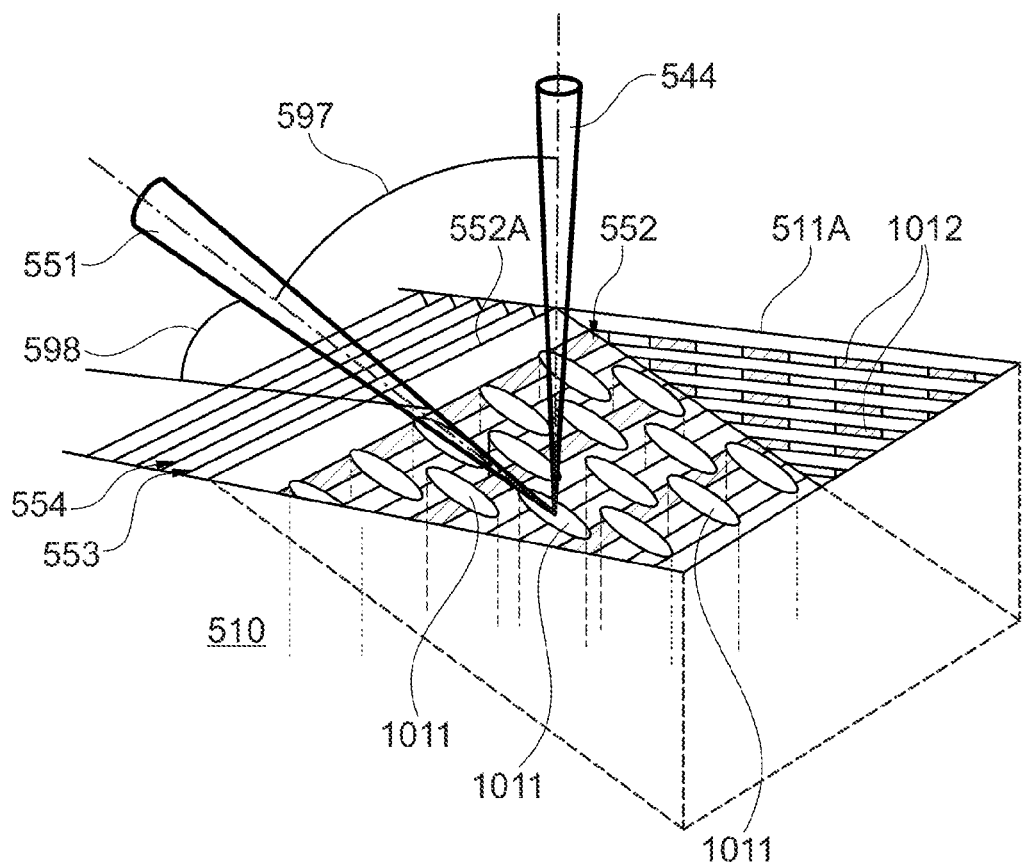
FIG. 3 is a detail view of a cross-section obtained by the slides-and-image process of FIG. 1 for a wafer that includes a 3D memory semiconductor device structure according to various examples.

FIG. 3 illustrates slice-and-imaging approach for a 3-D memory device. The wafer top surface 511A of the test volume 510 of the wafer 511 is milled with a FIB beam 551 at a milling angle 598 below 10° to the wafer surface, for example at milling angle of 8°, but other milling angles below 45° are possible as well, for example 40°, or 36°. A small milling angle 598 of between 8° and 45° may be preferred since is allows better imaging with high resolution. Such non-90° milling angles 598 are referred to as slanted milling.

FIG. 3 illustrates multiple layers 1012 of the 3-D memory device. The multiple layers 1012 can implement word lines of the memory write/read process. Also illustrated are the memory channels 1011

Also illustrated in FIG. 3 is a cutting edge 552A of the cross-section 552. The cutting edge 552 is the edge between the wafer top surface 511A and the cross-section 552. The cutting edge 552A can be visible in the 2-D images.

Figure 4:
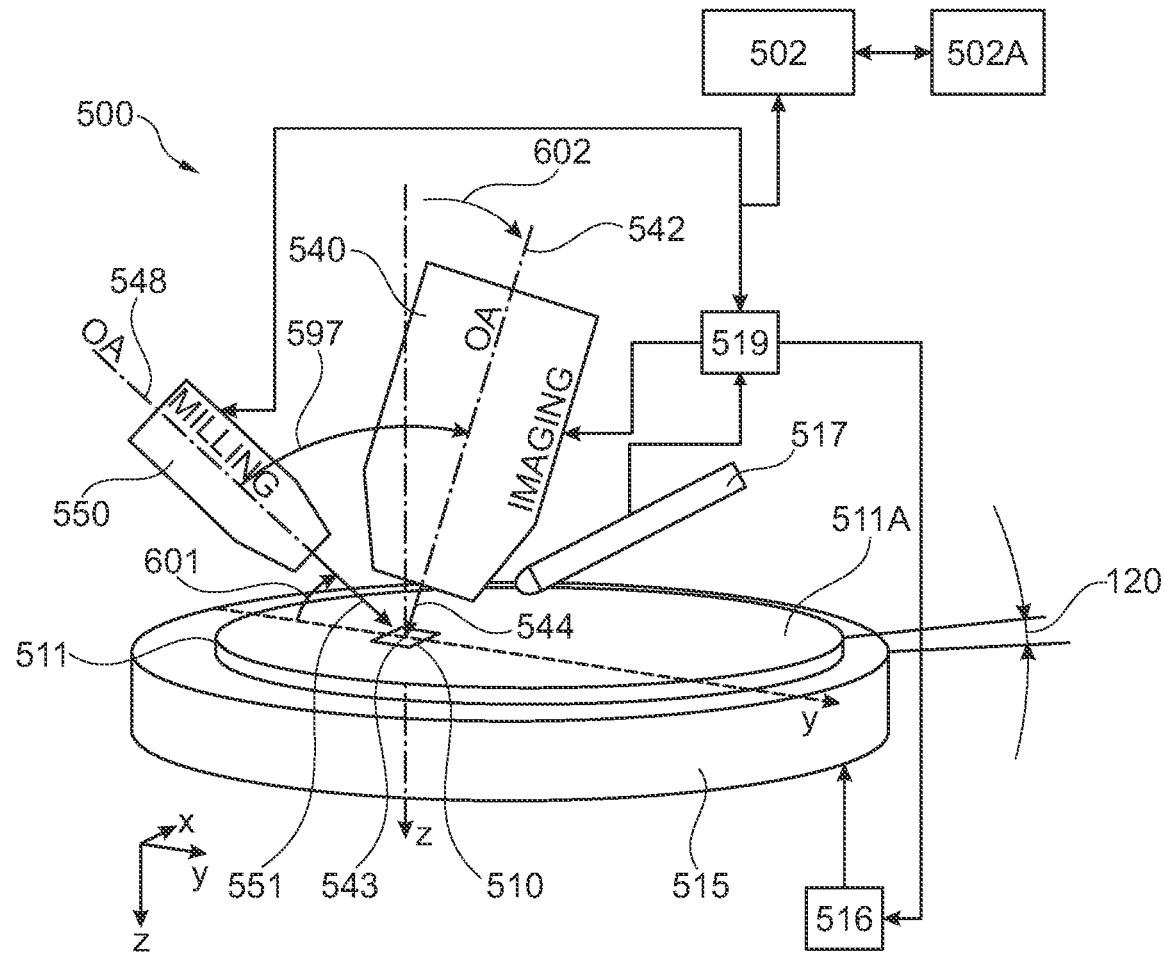
FIG. 4 schematically illustrates a dual beam device configured for executing a slice-and-image process according to various examples.

FIG. 4 schematically illustrates further aspects with respect to the DBD 500. The DBD 500 includes a sample stage 515 (or wafer stage) and a wafer 511—which could be an entire circular wafer or only a small cut-out, a so-called coupon or die—is mounted on the sample stage 515. A test volume 510 is aligned at the intersection point 543 of the imaging column 540 and the milling column 550.

The sample stage 515 defines an X-Y-plane. The Z-axis is oriented perpendicular to the X-Y-plane. The X-axis, Y-axis and Z-axis are defined in a machine coordinate system of the DBD 500.

The optical axis 548 of the milling column 550 and the optical axis 542 of the imaging column 540 enclose the imaging offset angle 597. The optical axis 542 forms an angle 602 with the z-axis, which defined to be perpendicular to the wafer plane.

At the intersection point 43, the wafer top surface 511A is arranged at angle 601 to the optical axis 548 of the milling column 550. This milling angle 601 depends on a wafer tilt 120. With the FIB 551 impinging under milling angle 601 onto the top surface of the wafer 511, slanted cross-sections are milled into the wafer by ion beam milling at the test volume 510.

The wafer tilt 120 between the wafer 511 and the sample stage 515 is illustrated. The wafer tilt 120 corresponds to an angle between the wafer top surface 511A and the X-Y-plane; as such, it can have two components, corresponding to the X-axis and the Y-axis, respectively. The wafer tilt 120 results in an inclination of the wafer normal (perpendicular to the wafer top surface 511A) with respect to the Z-axis.

The wafer tilt 120 can occur due to imperfect mounting of the wafer 111 on the sample stage 515. For instance, it would be possible that small dust particles are present on the bottom surface of the wafer 511 and/or on the top surface of the wafer stage 515. This can cause the wafer till 120. Furthermore, sometimes, the wafer 111 is attached to the top surface of the wafer stage 515 using adhesive pads. These adhesive pads can have nonplanar surfaces. According to various examples, it is possible to determine the wafer till 120 using the DBD 550, for example, based on the 2-D images 1001-1003.

Figure 5:
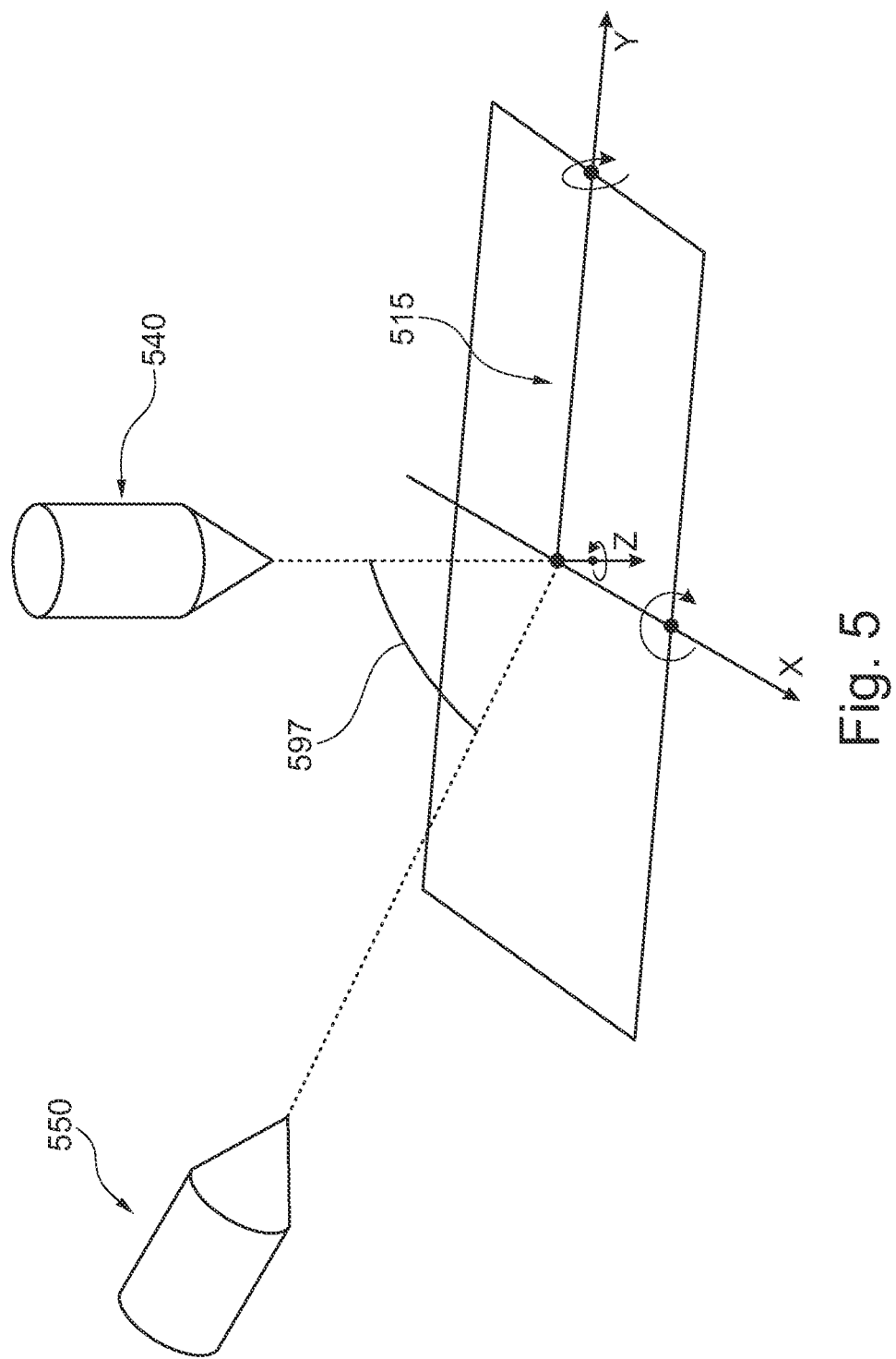
FIG. 5 schematically illustrates multiple degrees of freedom in positioning a wafer stage according to various examples.

During imaging, a beam of charged particles is scanned by a scanning unit of the imaging column 540 along a scan path over a cross-section surface of the wafer, and secondary particles as well as scattered particles are generated. A particle detector 517 collects at least some of the secondary particles and scattered particles and communicates the particle count with a control unit 519. The control unit 519 is in control of the imaging column 540 and the milling column 550 and connected to a control unit 516 to control the position of the wafer mounted on the wafer support table via the wafer stage 515. The wafer stage 515 can often be displaced in X, Y, and Z-direction, and can be rotated around X and/or Y direction (cf. FIG. 5).

The stage 515 can usually be rotated around a given axis by a precise angle. That is, if the initial tilt of the stage around a controllable axis is $\theta_0$, it can be rotated to a position corresponding to the tilt of $(\theta_0+\Delta\theta)$, where $\Delta\theta$ can be set very precisely. It is, however, challenging to determine the zero-point $\theta_0$ of the stage tilt with a sufficient accuracy. In some cases, there can be inaccuracies in $\theta_0$, e.g., while nominally $\theta_0:=0$, defacto $\theta_0 \neq 0$. These inaccuracies can lead to the stage being tilted against the X-Y-plane. Inaccuracies of the zero point of the stage tilt, thus, are considered herein to add to the wafer tilt.

A control unit 502 controls the overall acquisition protocol, stage positioning, triggers acquisition, reads out images, reconstructs 3-D tomographic images based on the machine coordinate system of the X-Y-Z-axes, and performs further post-processing. In some cases, the control unit 502 can determine the wafer tilt 120. The wafer tilt 120 can be taken into account (e.g., to rotate the machine coordinate system) when reconstructing the 3-D tomographic images or compensated for by changing the stage tilt of the wafer stage.

For instance, the control unit 502 could be implemented as a general-purpose processor that can load and execute program code from a non-volatile memory 502A.

Above, background aspects with respect to a slice-and-image process have been disclosed. The techniques described herein are based on the finding that sometimes the wafer tilt can affect the accuracy of quantitative analysis of semiconductor device structures. Accordingly, techniques are disclosed that facilitate to determine the wafer tilt 120 so that, subsequently, an accurate analysis of the semiconductor device structures is facilitated.

Figure 6:
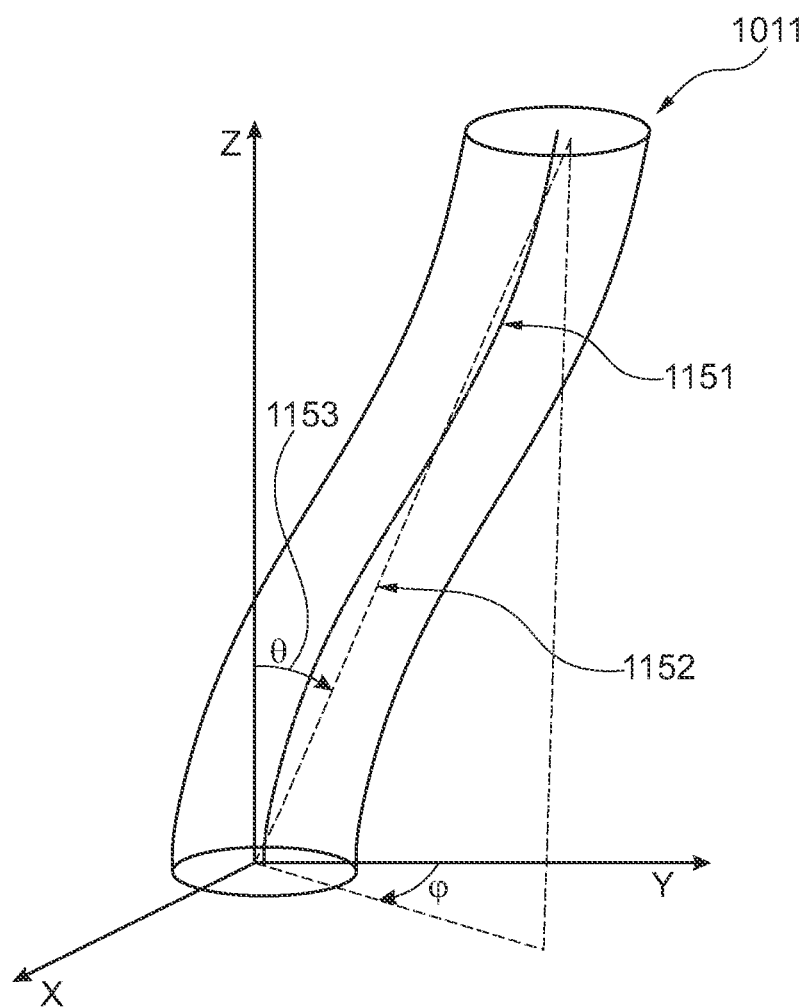
FIG. 6 schematically illustrates a memory channel of a 3D memory semiconductor device structure according to various examples.

The techniques described herein are not limited to a certain use case. Rather, the inspection of various semiconductor device structures can benefit from accurate knowledge of the wafer tilt 120. For instance, 3-D memory structures having vertical memory channels may be inspected. For instance, a geometric parameter of interest is the tilt of the memory channels with respect to the normal vector of the layers (e.g., the word lines), respectively the wafer normal. More generally, it may be desirable to determine the shape and/or orientation of the memory channel in 3-D. Here, the tilt can represent a first order approximation (linear approximation). For example, FIG. 6 is a schematic representation of a channel 1011. Here, the center axis 1151 is illustrated (dashed-dotted line), as well as the linear approximation 1152 (dotted line).

Where a DBD is used, to determine the tilt angle 1153 in absolute terms (or, more generally, the shape and/or orientation of the memory channel 1011, the wafer tilt 120 of the wafer 511 with respect to the sample stage 515 is typically used. According to the techniques disclosed herein, it is possible to determine the wafer tilt 120.

To determine the wafer tilt 120, it is possible to take into account—in explicit or implicit form—prior knowledge of one or more structures of the wafer when determining at least one component of the wafer tilt.

Based on one or more images and taking into account the prior knowledge of the one or more structures of the wafer, it is then possible to determine at least one component of the wafer tilt.

By taking into account the prior knowledge, it is possible to compare the appearance of the one or more structures of the wafer in the one or more images with the expectation defined by the prior knowledge. This comparison yields a difference between actual appearance and expectation and this difference can then yield the wafer tilt.

In general, there can be a tendency that the more explicit the prior knowledge, the fewer 2-D images may be used to determine the wafer tilt. For instance, where a certain geometric dimension of semiconductor devices is known, it may even be possible to determine the wafer tilt 120 from a single image by quantifying the geometric dimension in the single image and comparing against the expectation value provided by the prior knowledge. On the other hand, where the prior knowledge is only implicitly taken into account—e.g., by assuming planarity of at least one layer of the wafer—multiple images may be used to determine the wafer tilt.

For instance, in some examples, it would be possible that nominal appearances/expected appearances for certain structures of the wafer are stored in a database. These nominal appearances can be stored for a range of wafer tilts. Then, the actual appearance can be compared against these nominal appearances using an image-to-image comparison and the best match can be identified. The best match then defines the wafer tilt. For instance, it would be possible that the nominal appearances are stored in a parametrized manner with a parameter being the wafer tilt. Then, respective images can be generated by changing, as a parameter, the wafer tilt.

In another scenario, it would also be possible to extract geometrical parameters of the actual appearance of the wafer structures from the 2-D images and then, using predetermined calculations, determine the wafer tilt based on these geometrical parameters. Such a scenario is not based on an image-to-image comparison, but rather uses scalar calculations to derive the wafer tilt.

In general, there are various options for prior knowledge that can be considered when determining the wafer tilt.

Such techniques are based on the finding that—e.g., depending on the type of wafer—different types of structures can be suited for being considered in connection with the prior knowledge. In some cases, it can be helpful to consider such structural properties of structures as prior knowledge that are known at a high degree of certainty, e.g., are not subject to significant variations during the fabrication process and/or are not prone to defects. This ensures that additional variations in the appearance are not introduced due to variations or defects, but rather to the wafer tilt as primary source. In other words, this ensures that variations in the appearance of structural properties of such structures are unambiguously indicative of the wafer tilt and not due to other causes.

Some of these options for prior knowledge are summarized in TAB. 1 below. These examples are based on semiconductor device structures that are manufactured from a sequence of layers being parallel to a substrate of the wafer. For example, in a logic-type sample, metal lines are running parallel in metal layers or high aspect ratio structures and metal vias run perpendicular to the metal layers. The angle between metal lines in different layers is either 0° or 90°. On the other hand, for VNAND type structures it is known that their cross sections are circular on average. Such prior knowledge can be exploited in the examples.

TABLE 1

Multiple options for prior knowledge that can be taken into account when determining at least one component of a wafer tilt. It is noted that in addition to prior knowledge, as discussed above in TAB. 1, pertaining to structures of the wafer, further prior knowledge can be available and used in determining the wafer till. Such further prior knowledge can pertain to the slice-and-image process, e.g., pertain to the milling depth and/or the relative stage tilt. Here, where multiple images are acquired at multiple milling depths and/or multiple stage tools, the relative change of such parameters (e.g., milling depth offset and/or stage tilt) can be known at greater accuracy. For instance, it can be assumed that the wafer stage 515 can be rotated around a controllable axis by a precise angle - e.g., with an accuracy of a few arcmin. Further, it can be assumed that the stage can be positioned such that the angle between the wafer normal and the optical axis of the imaging column is below ~1-2°. Finally, it can be assumed that column offset angle 597 is fixed and known to a few arcmin uncertainty.

| Option | Prior knowledge | Example details |
|---|---|---|
| I | Prior knowledge regarding a size of semiconductor device structures | For example, it would be possible to determine the wafer tilt based on prior knowledge regarding a size of semiconductor device structures. An imaged value of the size (as appearing in the images) can be compared against an expected value of the size. Thereby, the wafer tilt can be determined.<br>For instance, the depth offset between multiple semiconductor device layers 1012 (cf. FIG. 3) may be available as prior knowledge. The depth offset may be known at great accuracy and may not be subject to process variations. The imaged distance of the multiple layers can be compared against the prior knowledge of |

TABLE 1-continued

Multiple options for prior knowledge that can be taken into account when determining at least one component of a wafer tilt. It is noted that in addition to prior knowledge, as discussed above in TAB. 1, pertaining to structures of the wafer, further prior knowledge can be available and used in determining the wafer tilt. Such further prior knowledge can pertain to the slice-and-image process, e.g., pertain to the milling depth and/or the relative stage tilt. Here, where multiple images are acquired at multiple milling depths and/or multiple stage tools, the relative change of such parameters (e.g., milling depth offset and/or stage tilt) can be known at greater accuracy. For instance, it can be assumed that the wafer stage 515 can be rotated around a controllable axis by a precise angle - e.g., with an accuracy of a few arcmin. Further, it can be assumed that the stage can be positioned such that the angle between the wafer normal and the optical axis of the imaging column is below ~1-2°. Finally, it can be assumed that column offset angle 597 is fixed and known to a few arcmin uncertainty.

| Option | Prior knowledge | Example details |
| --- | --- | --- |
| II | Prior knowledge regarding planarity of a layer of the wafer | the depth offset. From this comparison, the wafer tilt can be deduced.<br>Here, it would be possible to assume that one or more layers of the wafer are planar. Thereby, e.g., based on a change of appearance of edges of such layers in multiple images - acquired, e.g., at multiple stage tilts and/or multiple milling depths - conclusions on the wafer tilt can be drawn.<br>Such layers could pertain to buried semiconductor device layers 1012 and/or the wafer top surface 511A and the associated cutting edge 552A (cf FIG. 3).<br>Such techniques are based on the finding that typically relative changes in the stage tilt and/or milling depth can be quantified at great accuracy. Then, an observed change in the appearance of the edge of a planar layer - due to the changing of the stage tilt - can be compared against an expected change in the appearance, for different assumed wafer tilts. Thereby, the wafer tilt can be determined. |

Next, some examples of implementations of the techniques of TAB. 1 are explained below in connection with TAB. 2.

TABLE 2

Various options for determining the wafer tilt. Some of these examples include acquiring multiple images. To increase the accuracy, it can be helpful to implement an active drift compensation. This can be based on landmarks. For instance, the landmarks can be milled into the top surface 511A of the wafer.

| Example | Cf. TAB. 1 | Example details |
| --- | --- | --- |
| First example | Option I | The wafer tilt 120 (or, directly associated therewith, the angle between the imaging column 540 and the wafer normal) can be determined based on the orientation and/or spacing/offset of the wordline layers of a 3-D memory device in a single image depicting a cross-section through the respective wafer.<br>Here, two orthogonal distances between the multiple semiconductor layers 1012 can be determined in a single images. For this, two components of the wafer tilt 120 can be determined. |
| Second example | Option II | The wafer tilt 120 is determined based on multiple images acquired at different stage tilts. Here, the change of appearance of multiple layers is considered across the multiple images, such as the change of the imaged distance between adjacent ones of the multiple layers. |
| Third example | Option II | The wafer tilt 120 is determined based on multiple images acquired at different stage tilts. Here, the change of appearance of at least one layer is considered across the multiple images, such as the change of the imaged orientation of a respective edge of the at least one layer. |
| Fourth example | Option IV | The wafer tilt 120 is determined based on multiple images acquired at different milling depths. Here, the change of appearance of at least one layer is considered across the multiple images, such as the change of the imaged position of a respective edge of the at least one layer. |

Next the examples of TAB. 2 are explained in greater detail.

First, the first example (cf. TAB. 2) of determining the wafer tilt is explained in greater detail.

Figure 7:
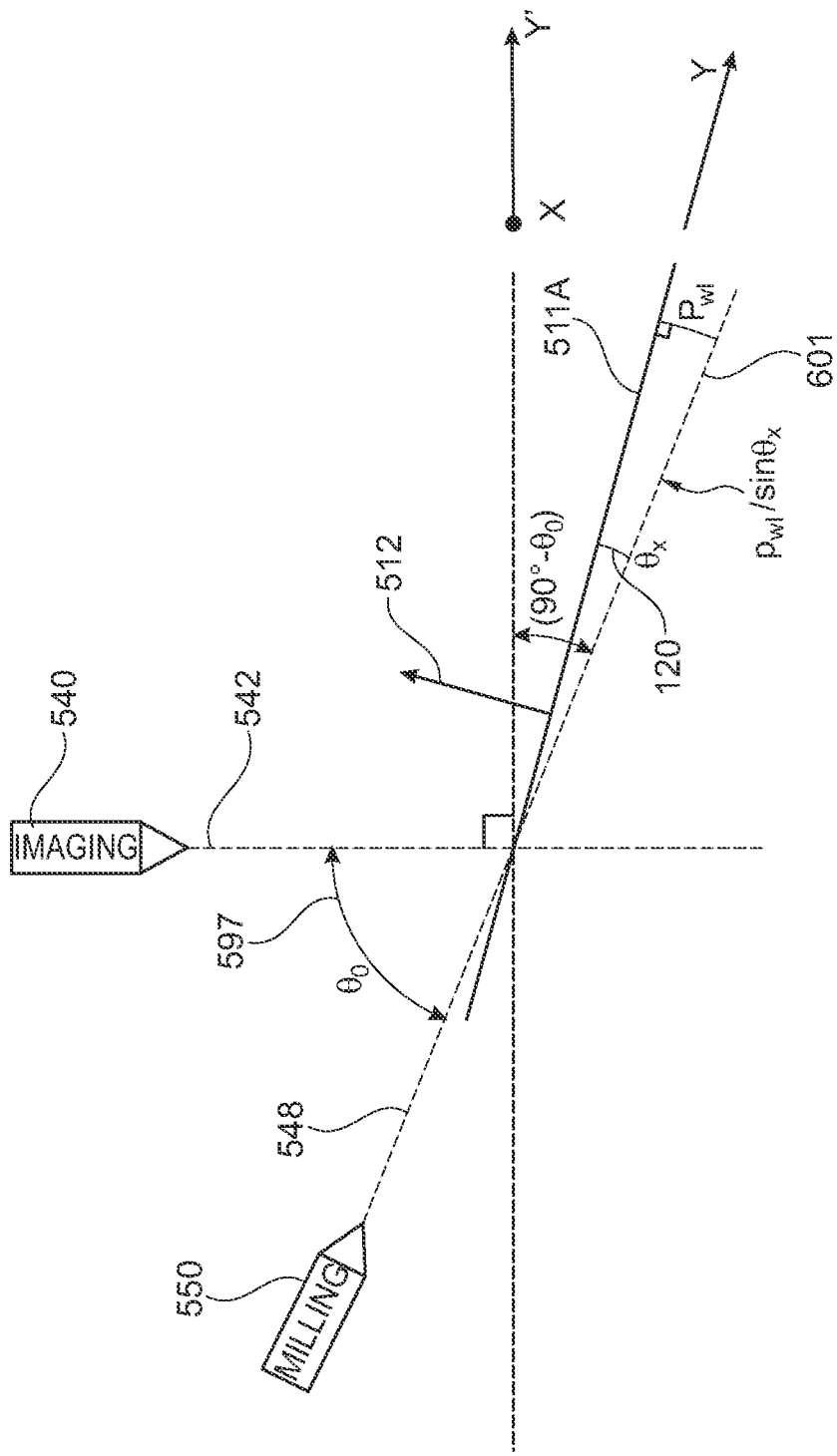
FIG. 7 is a 1D illustration of a set up for determining a wafer tilt according to various examples.

This technique is based on the finding that, if the wafer surface is close to being orthogonal to the imaging beam (normal working configuration), the orientation and spacing of the word-line surfaces are not very sensitive to the misalignment between the sample normal and the beam direction. To increase the sensitivity, it is possible to tilt the sample around X-axis such that the angle between the wafer surface and the optical axis 548 of the milling column 550 is reduced to a few degrees. Thus, the angle between the sample normal and the optical axis 542 of the imaging column 540 is inclined against 90°. This is illustrated in FIG. 7 (a 1-D view). Here, the wafer normal 512 of the wafer surface 511A of the wafer 511 is illustrated.

As explained above, although the absolute tilt angle of the sample can only be determined with an accuracy of ~1-2°, the angle by which the sample is tilted is controlled much more precisely—down to a few arcmin. The wafer surface 511A forms a shallow angle $\theta_x$ with the optical axis 548 of the milling column 550.

In this configuration, an image of the respectively milled cross-section showing several wordline layers is acquired with the imaging column 540. The orientation and inter-layer offset (pitch) of the wordline semiconductor device layers in the acquired image depends on the angle $\theta_x$ (and a similar angle $\theta_y$ along y-axis)—characterizing the orientation of the wafer 511 with respect to the optical axis 542 and the optical axis 548 (and hence quantifying a respective component of the wafer tilt 120).

Then, the stage 515 can be rotated around the axis X by the angle $(\theta_0-\theta_x)$, to align the wafer normal 512 with the optical axis 542. Now, the misalignment angle between the optical axis 542 of the imaging column 540 and the wafer normal 512 is equal to $\theta_y$ (within a few arcmin). This component of the wafer tilt can either be reduced to zero by rotating the wafer stage around the axis Y by the angle $\theta_y$ or the computed angle can be taken into account in the 3D-reconstruction of the sample volume (e.g., computation of tilts and wiggling of the channels etc.).

Below, a way to compute $\theta_x$ and $\theta_y$ from the orientation and offsets of the wordline semiconductor device layers in a single image acquired in the s hallow angle configuration corresponding to FIG. 7 is provided.

Figure 8:
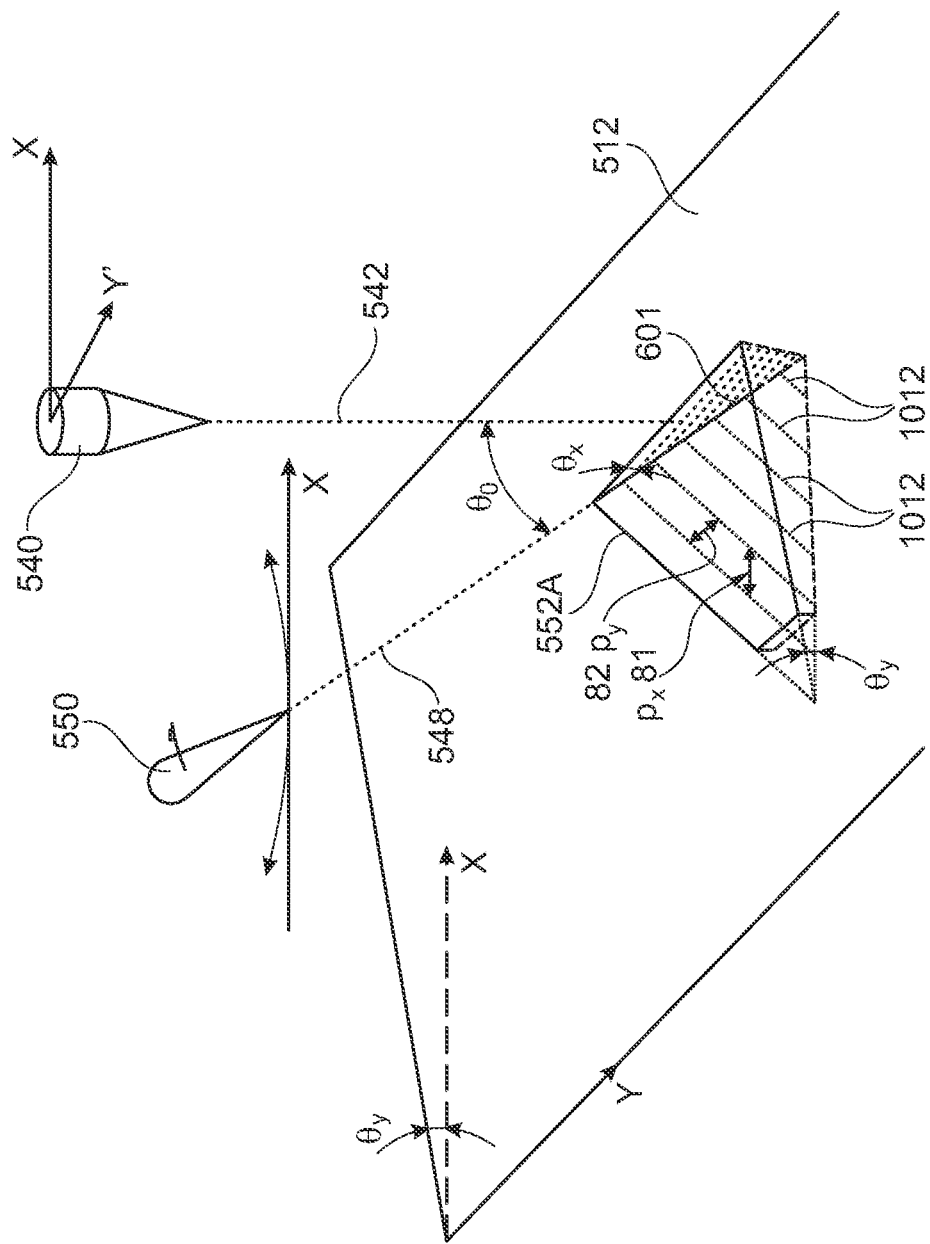
FIG. 8 is a 2D illustration of the set up for determining a wafer tilt according to the examples of FIG. 7.

This is explained in connection with FIG. 8. FIG. 8 is a 2-D view of the scenario of FIG. 7. In FIG. 7, the image plane is formed by the axes X and Y'. The X-axis is orthogonal to the both milling and imaging beams. The Y' axis is orthogonal to the imaging beam and lies within the plane formed by the two beams. In general, it would be possible that the image plane is defined by axes X' and Y' that each may or may not differ from X and Y axes (in FIG. 8, X'=X).

In the first example, it is assumed that $p_{wl}$ is the depth offset between adjacent wordline semiconductor device layers orthogonal to the wafer surface (this depth offset known is known as prior knowledge); $p_x$ and $p_{y'}$ are the two orthogonal distances 81, 82 between two adjacent wordline semiconductor device layer edges 1012 appearing in the image of a cross-section on the trench surface projected to the directions X and Y', respectively. The values $p_x$ and $p_{y'}$ are the offsets between adjacent wordline semiconductor device layers measured in the image of the trench 602 in the shallow-angle configuration illustrated in FIG. 7 and FIG. 8.

Then, one obtains the angles to the optical axis 548 of the milling column 550:

$$\sin\theta_y = \frac{p_{wl}}{p_x}, \quad (1)$$

$$p_{y'} = \frac{p_{wl}}{\sin\theta_x}\sin\theta_0, \quad (2)$$

from which the angles $\theta_x$ and $\theta_y$ can be computed as two orthogonal components of the wafer tilt.

Above, the first example (cf. TAB. 2) of determining the wafer tilt 120—implementing option I in TAB. 2—has been explained. Below the second example (cf. TAB. 2) of determining the wafer tilt 120—implementing option II in TAB. 2—will be explained.

This second example is based on the finding that the size of a geometrical parameters of the semiconductor device structures—e.g., $p_{wl}$—is not always known with a sufficient accuracy. Where a geometric parameter is not known at sufficient accuracy, multiple images may be used and at least one edge of wordline semiconductor device layers may be used to calculate the wafer tilt. The prior knowledge that is relied upon pertains to the planarity of the wordline semiconductor device layers.

In this second example, the distances between edges of layers such as adjacent semiconductor device layers are determined for each one of multiple images that are acquired at different stage tilts and a change of these distances across the multiple images is considered. The change of these distances depends on the wafer tilt 120.

For instance, it is possible to derive the angles $\theta_x$ and $\theta_y$ (wafer tilt 120) from the ratio $$r = \frac{p_{y'}}{p_x}$$

of the two orthogonal imaged distances between edges of adjacent wordline semiconductor device layers appearing in the respective image in the X and Y directions. The ratio is measured for at least two different stage tilts of the stage, using a tilt against the wafer normal. It is assumed that $r_1$ is measured with a tilt angle $(\theta_0-\theta_x)$ and $r_2$—with a tilt angle $(\theta_0-(\theta_x+\Delta))$, where $\Delta$ shall be chosen to be similar to $\theta_x$, e.g., 1-2°. The two ratios can be expressed as $$r_1 = \frac{\sin\theta_y}{\sin\theta_x}\sin\theta_0, \quad (3)$$

$$r_2 = \frac{\sin\theta_y}{\sin(\theta_x + \Delta)}\sin\theta_0. \quad (4)$$

Since $r_1$ and $r_2$ are measured for the same cross-section, the two equations above can be resolved to find $\theta_x$ and $\theta_y$.

Above, the second example (cf. TAB. 2) of determining the wafer tilt 120—implementing option II of TAB. 2—has been explained. Below, the third example (cf. TAB. 2) of determining the wafer tilt 120—implementing option II in TAB. 2. is explained.

This third example is based on the finding that sometimes it may not be possible to rely on multiple layers (as in the second example above). In the third example, only a single edge of a single layer is considered. The change of the appearance of this single layer is considered in multiple images. For instance, it would be possible to rely on the cutting edge of the slanted milling with the top layer of the wafer (wafer surface) 511A. Also, a cross-sectional edge of the slanted milling with respect to a buried semiconductor device layer could be considered, e.g., a cross-sectional edge of a wordline layer.

In the third example, the change of the orientation of the edge can be considered. Thus, while in the second example the distance between adjacent edges has been considered as changing appearance across multiple images, in this third example the change of the orientation of a single edge is considered as changing appearance across multiple images.

In some cases, the ratio r—defined in Eqs. 1 and 2—is also equal to the orientation of the edge, such as the tangent of the angle between the projection of this edge to the XY'-plane (image plane) and the X-axis. The change of this orientation can be considered through changes in r in Eqs. 3 and 4. The angles $\theta_x$ and $\theta_y$ can subsequently be determined by solving Eqs. 3 and 4.

Above, the third example (cf. TAB. 2) of determining the wafer tilt 120—implementing option II of TAB. 2—has been explained. Below, the fourth example (cf. TAB. 2) of determining the wafer tilt 120—implementing option II in TAB. 2. is explained.

For example, the second and third examples have been described above where multiple images are used that are acquired at different stage tilts—hence, the parameter Δ in Eqs. 3 and 4. Alternatively, in the fourth example, multiple images could be used that are acquired at multiple milling depths 599.

In such cases the wafer tilt can be found if the slicing thickness (e.g., the milling depths) is known with reasonable precision, as further ground truth. This is illustrated in FIG. 9.

Figure 9:
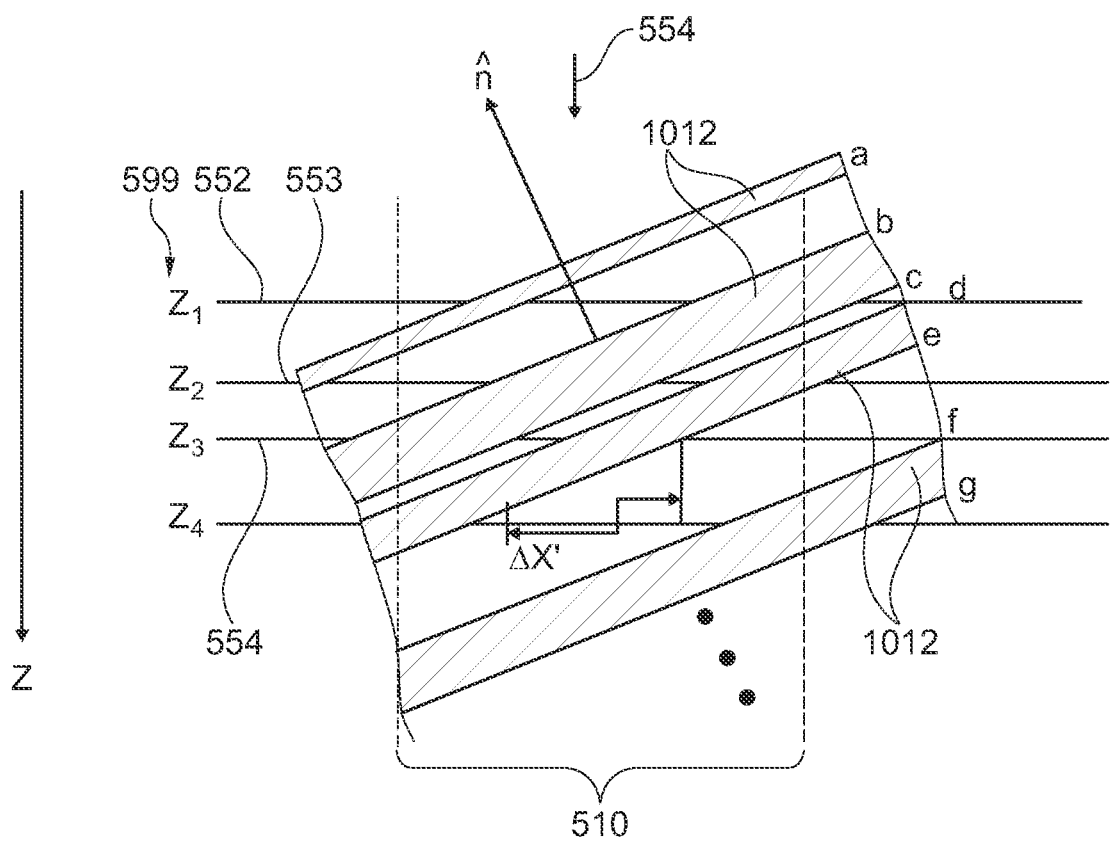
FIG. 9 schematically illustrates multiple cross-sections of a test volume of the wafer obtained by a slice-and-image process at different milling depth according to various examples.
Figure 10:
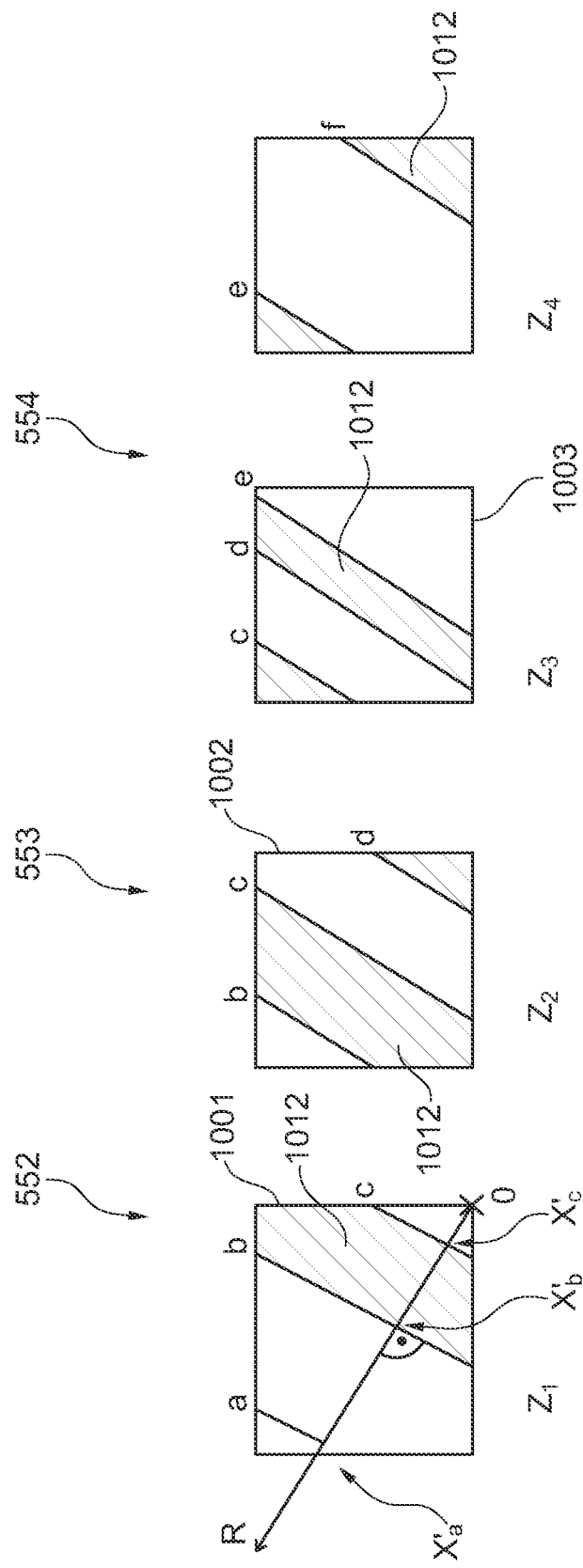
FIG. 10 schematically illustrates multiple images taken for the multiple cross-sections of FIG. 10.

FIG. 9 schematically illustrates cross-sections obtained by slanted milling through multiple semiconductor device layers 1012. "a"-"g" denote features and the respective imaged positions of these features are shown in FIG. 10. FIG. 10 illustrates the respective images is obtained using the imaging column 540. The R-coordinate in these figures is the image coordinate measured in the direction perpendicular to the features "a"-"g".

This sequence of images 1001-1003 shows how the transition regions (a) to (g) progress perpendicular to an axis R with progressing milling depth 599. The transition regions show up as edges between the different semiconductor device layers 1012.

Figure 11:
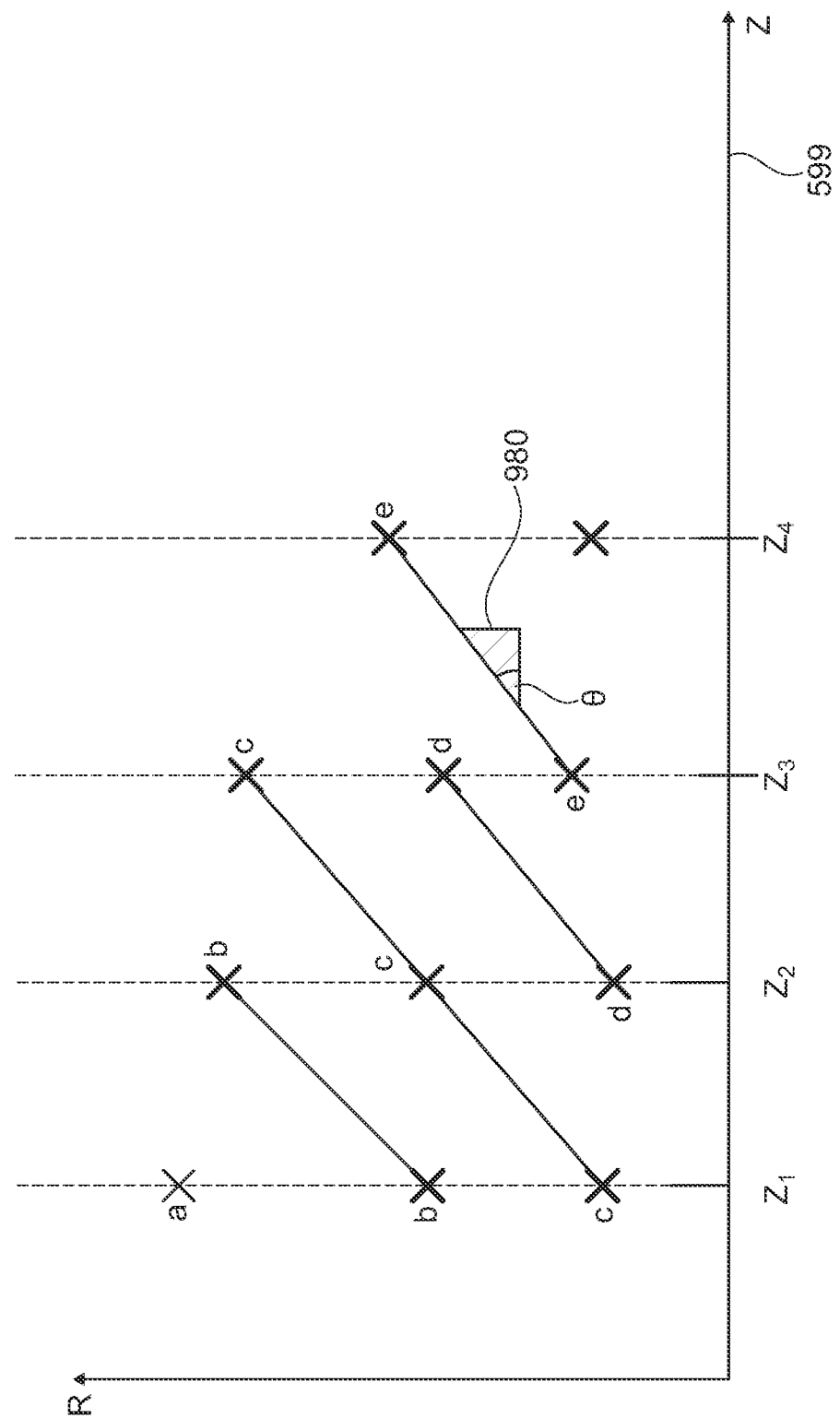
FIG. 11 schematically illustrates determining offsets between image positions of multiple layers of the multiple images of FIG. 10 according to various examples.

In some cases, the change of the imaged positions can be considered. This is illustrated in FIG. 11 where the imaged position of the various features associated with the semiconductor device layers 1012 along the R axis is plotted across the multiple images 1001-1003 and thus for different milling depths. The change of position corresponds to the slope 980 of these plots. Based on this, the wafer tilt 120 can be determined. From the progression lengths ΔR of each boundary from image to image and the known Δz the desired tilt angle Θ can be found.

Note that the milling depth offset should be large enough to obtain a significant offset; but small enough so that the imaged positions of the layers can be tracked across the images. This also applies to the selection of the appropriate milling angle.

From the orientation of the axis R, the orientation of the sample normal n against the optical axes 542, 548 can be determined, e.g., the direction of the wafer tilt 120.

By turning the sample according to the azimuth and tilt angle with high precision any desired angle between the sample and the SEM/HIM axis can be adjusted. In other words, further images can be acquired at a different rotation of the sample stage (around Z-axis; cf. FIG. 5) and then the process can be repeated. In some cases, further offsets between further imaged positions of the at least one layer can be determined across the multiple further images obtained at a different rotation.

While in connection with FIG. 9, FIG. 10, and FIG. 11 a scenario has been explained in which a total of 4 semiconductor device layers 1012 is tracked across multiple images obtained at multiple milling depth, it would be generally possible that fewer or more layers are considered. It would even be possible to only consider a single layer. In general, the more edges of layers can be tracked, the higher the accuracy (statistical averaging). Similarly, the more images are acquired, the higher the accuracy (statistical averaging).

Figure 12:
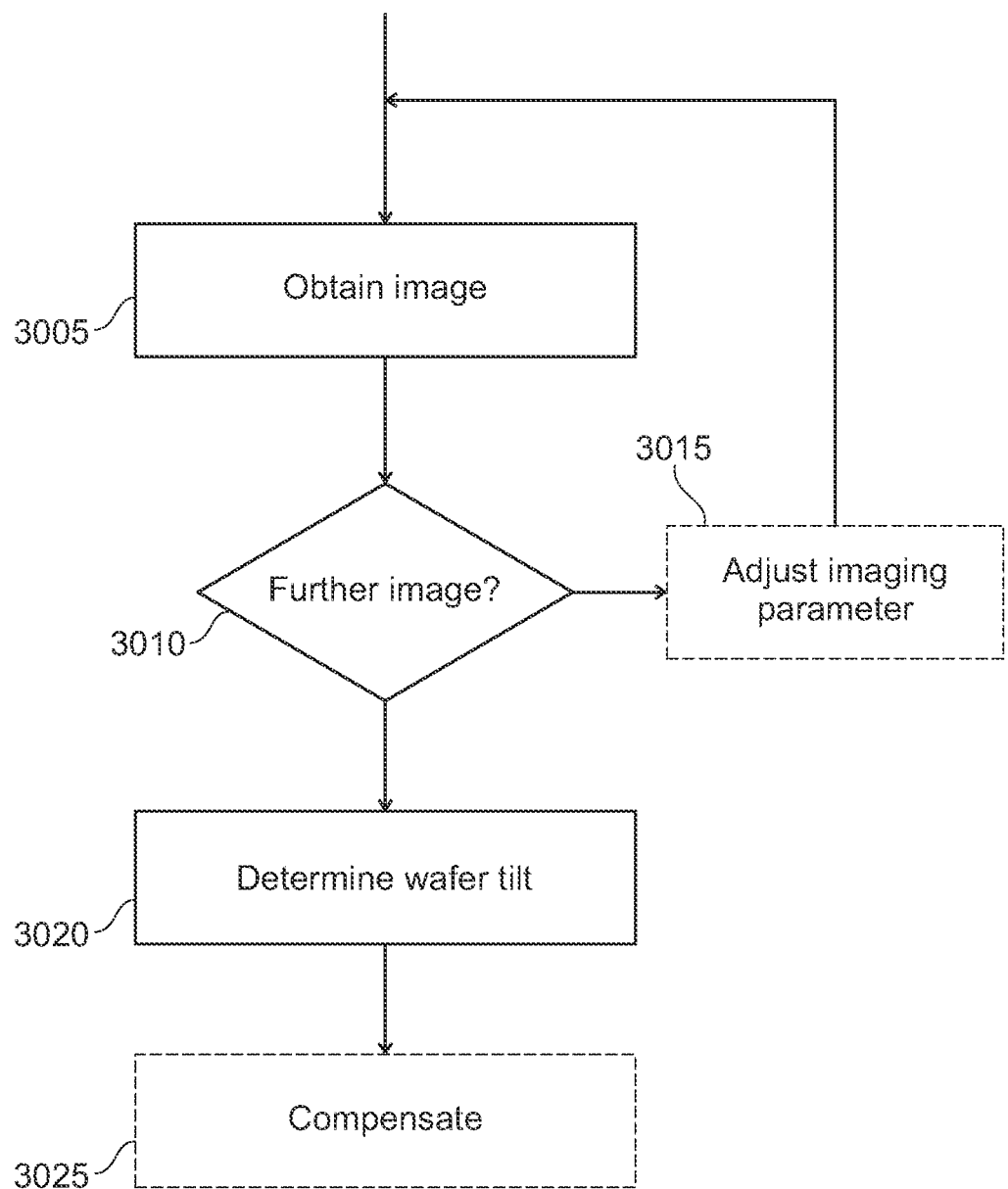
FIG. 12 is a flowchart of a method according to various examples.

FIG. 12 is a flowchart of a method according to various examples. The method of FIG. 12 could be executed by a processor upon loading and executing program code from a memory. For instance, the method of FIG. 12 could be executed by the control unit 502 upon loading and executing program code from the memory 502A. Optional boxes are illustrated with dashed lines.

At box 3005, an image is obtained. The image has been acquired using a slice-and-image process. For instance, obtaining the image at box 3005 can include controlling a control unit such as the control unit 519 of the dual beam device 500 to acquire a respective image. The image illustrates a cross-section of a test volume of a sample stage. The image is associated with a given set of imaging parameters. Obtaining the image at box 3005 could also include loading the pre-acquired image from a database.

Next, at box 3010, it is checked whether a further image is desirable. For instance, a certain predefined amount of images can be obtained and, at box 3010, it can be checked whether all images that are desirable have already been obtained. For instance, in some scenarios only a single image may be desirable (cf. TAB. 2: first example).

Optionally, it is possible to adjust at least one imaging parameters of an associated set of imaging parameters at box 3015. For instance, it would be possible to change the milling depth (cf. TAB. 2: 4th example). It would also be possible to change the stage tilt (cf. TAB. 2: second example and 3rd example).

Then, at the next iteration of box 3005, a further image is obtained.

Once all images have been obtained, at box 3020, one or more components of the wafer tilt are determined. Techniques have been disclosed above that facilitate determining the one or more components of the wafer tilt, cf. TAB. 1 and cf. TAB. 2.

In general, where applicable, multiple such techniques may be combined with each other, to achieve higher accuracy.

Optionally, at box 3025, the determined wafer tilt can be compensated for. This can be achieved either by hardware compensation, e.g., by applying an additional tilt offset to the wafer stage that compensates for the wafer tilt. Alternatively or additionally, the wafer tilt could also be digitally compensated in postprocessing. For instance, where a 3-D tomographic image is determined, the wafer tilt can be used to pre-skew or distort the individual images such that the 3-D tomographic image depicts the wafer with reduced impact from the wafer tilt. For instance, where certain parameters of semiconductor device structures (such as the angle 1153 of memory channels 1011; cf. FIG. 6) are determined, such parameters can be compensated based on the determined wafer tilt.

Although the disclosure has been shown and described with respect to certain preferred embodiments, equivalents and modifications will occur to others skilled in the art upon the reading and understanding of the disclosure. The present disclosure includes all such equivalents and modifications and is limited only by the scope of the appended claims.

For illustration, above, scenarios have been disclosed in which the wafer tilt is determined with respect to a machine coordinate system of the DBD. In general, using the disclosed techniques, various representations of the wafer tilt, e.g., the wafer tilt with respect to an imaging plane or with respect to a stage tilt may be determined. The respective transformations are readily available.

Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible program carrier for execution by, or to control the operation of, a processing device. Alternatively or in addition, the program instructions can be encoded on a propagated signal that is an artificially generated signal, e.g., a machine-generated electrical, optical, or electromagnetic signal that is generated to encode information for transmission to suitable receiver apparatus for execution by a processing device. A machine-readable medium can be a machine-readable storage device, a machine-readable storage substrate, a random or serial access memory device, or a combination of one or more of them.

The term "processing device" encompasses all kinds of apparatus, devices, and machines for processing information, including by way of example a programmable processor, a computer, or multiple processors or computers. The apparatus can include special purpose logic circuitry, e.g., an FPGA (field programmable gate array) or an ASIC (application-specific integrated circuit) or RISC (reduced instruction set circuit). The apparatus can also include, in addition to hardware, code that creates an execution environment for the computer program in question, e.g., code that constitutes processor firmware, a protocol stack, an information base management system, an operating system, or a combination of one or more of them.

A computer program (which may also be referred to as a program, software, a software application, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or information (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input information and generating output. The processes and logic flows can also be performed by, and apparatus can also be implemented as, special purpose logic circuitry, e.g., an FPGA (field programmable gate array) or an ASIC (application-specific integrated circuit) or RISC.

Computers suitable for the execution of a computer program include, by way of example, general or special purpose microprocessors or both, or any other kind of central processing unit. Generally, a central processing unit will receive instructions and information from a read-only memory or a random access memory or both. The essential elements of a computer are a central processing unit for performing or executing instructions and one or more memory devices for storing instructions and information. Generally, a computer will also include, or be operatively coupled to receive information from or transfer information to, or both, one or more mass storage devices for storing information, e.g., magnetic, magneto-optical disks, or optical disks. However, a computer need not have such devices. Moreover, a computer can be embedded in another device, e.g., a mobile telephone, a smartphone or a tablet, a touch-screen device or surface, a personal digital assistant (PDA), a mobile audio or video player, a game console, a Global Positioning System (GPS) receiver, or a portable storage device (e.g., a universal serial bus (USB) flash drive), to name just a few.

Computer-readable media (e.g., one or more machine readable hardware storage devices) suitable for storing computer program instructions and information include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and (Blue Ray) DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back-end component, e.g., as an information server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital information communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other. In another example, the server can be in the cloud via cloud computing services.

While this specification contains many specific implementation details, these should not be construed as limitations on the scope of any of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be used. Moreover, the separation of various system components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be used.

The following provides 15 examples of non-limiting embodiments of the disclosure.

Embodiment 1

A computer-implemented method, including:
obtaining one or more images (1001, 1002, 1003) of a test volume (510) of a wafer (511) mounted on a sample stage (515) of a dual-beam device (500), the one or more images (1001, 1002, 1003) being acquired using an imaging column (540) of the dual-beam device (500) and depicting one or more cross-sections (552, 553, 554) of the test volume (510) at one or more stage tilts of the sample stage (515) and obtained by slanted milling of the wafer (511) using a milling column of the dual-beam device (500), and
by taking into account prior knowledge of one or more structures (511A, 552A, 1001, 1002, 1003, 1011, 1012) of the wafer (511) and based on the one or more images (1001, 1002, 1003), determining at least one component of a wafer tilt (120) of the wafer (511) with respect to the sample stage (515).

Embodiment 2

The computer-implemented method of embodiment 1,
wherein the one or more structures include semiconductor device structures (1001, 1002, 1003, 1011, 1012, 1012) of the wafer (511),
wherein the prior knowledge includes a size of the semiconductor device structures (1001, 1002, 1003, 1011, 1012, 1012).

Embodiment 3

The computer-implemented method of embodiment 2,
wherein the size includes a depth offset between multiple semiconductor device layers (1012),
wherein the at least one component of the wafer tilt (120) is determined based on an imaged distance (81, 82) between the multiple semiconductor device layers (1012) in each one of the one or more images (1001, 1002, 1003) and further based on the depth offset.

Embodiment 4

The computer-implemented method of embodiment 3,
wherein two orthogonal imaged distances are determined between the multiple semiconductor device layers (1012) in the image (1001, 1002, 1003),
wherein two orthogonal components of the wafer tilt (120) are determined based on two orthogonal distances (81, 82) between the multiple semiconductor device layers (1012) in each one of the one or more images (1001, 1002, 1003).

Embodiment 5

The computer-implemented method of any one of embodiments 1-4,
wherein the one or more structures (511A, 552A, 1001, 1002, 1003, 1011, 1012) include at least one layer (511A, 1012) of the wafer (511),
wherein the prior knowledge includes a planarity of the at least one layer (511A, 1012).

Embodiment 6

The computer-implemented method of embodiment 5,
wherein the one or more images (1001, 1002, 1003) include multiple images (1001, 1002, 1003) depicting a single cross-section (552, 553, 554) of the test volume (510) at multiple stage tilts of the sample stage (515),
wherein the method further includes:
for each one of the multiple images (1001, 1002, 1003):
detecting at least one edge (552A) of the at least one layer (511A, 1012) of the wafer (511) in the respective image (1001, 1002, 1003),
wherein the at least one component of the wafer tilt (120) of the wafer (511) is determined based on a change of an appearance of the at least one edge between the multiple images (1001, 1002, 1003) and further based on further prior knowledge of the multiple stage tilts.

Embodiment 7

The computer-implemented method of embodiment 6, wherein the at least one layer includes multiple layers (1012),
wherein the method further includes:
for each one of the multiple images (1001, 1002, 1003):
determining an imaged distance between adjacent edges of different ones of the multiple layers (1012) in the respective image (1001, 1002, 1003),
wherein the at least one component of the wafer tilt (120) is determined based on the change of the imaged distance between the multiple images (1001, 1002, 1003).

Embodiment 8

The computer-implemented method of embodiment 7,
wherein two orthogonal imaged distances are determined between adjacent edges of different ones of the multiple layers in the respective image and for each one of the multiple images (1001, 1002, 1003),
wherein two orthogonal components of the wafer tilt (120) are determined based on the change of each one of the two orthogonal image distances between the multiple images (1001, 1002, 1003).

Embodiment 9

The computer-implemented method of any one of embodiments 6 to 8, further including:
for each one of the multiple images (1001, 1002, 1003):
determining an imaged orientation of the at least one edge (511A, 1012 in the respective image,
wherein the wafer tilt (120) is determined based on the change of the image orientation between the multiple images (1001, 1002, 1003).

Embodiment 10

The computer-implemented method of any one of embodiments 6 to 9,
wherein the at least one edge (552A) includes a cutting edge (552A) of the slanted milling with respect to a wafer top surface (511A) of the wafer (511).

Embodiment 11

The computer-implemented method of any one of embodiments 6 to 10,
wherein the at least one edge includes a cross-sectional edge of the slanted milling with respect to a semiconductor device layer (1012) of the wafer (511).

Embodiment 12

The computer-implemented method of embodiment 5,
wherein the one or more images (1001, 1002, 1003) include multiple images (1001, 1002, 1003) depicting multiple cross-sections (552, 553, 554) obtained by the slanted milling at multiple milling depths (599) and a single stage tilt,
wherein the method further includes:
determining one or more offsets between imaged positions of the at least one layer between the multiple images (1001, 1002, 1003),
wherein the at least one component of the wafer tilt (120) is determined based on further prior knowledge of the multiple milling depths (599) and based on the one or more offsets.

Embodiment 13

The computer-implemented method of embodiment 12,
wherein the multiple images (1001, 1002, 1003) are obtained for a first rotation of the sample stage (515) with respect to the imaging column (540),
wherein the method further includes:
obtaining multiple further images (1001, 1002, 1003) of the test volume (510) of the wafer (511) mounted on the sample stage (515) of the dual-beam device (500), the multiple further images (1001, 1002, 1003) being acquired using the imaging column (540) of the dual-beam device (500) and depicting multiple further cross sections of the test volume (510) obtained by slanted milling at multiple further milling depths using the milling column of the dual-beam device (500), the multiple further images (1001, 1002, 1003) being obtained for a second rotation of the sample stage (515) with respect to the imaging column (540), the first rotation being different from the second rotation,
determining one or more further offsets between further imaged position of the at least one layer of the wafer (511) between the multiple further images (1001, 1002, 1003), and
based on the further prior knowledge of the multiple further milling depths and based on the one or more further offsets, determining a further component of the wafer tilt (120).

Embodiment 14

The computer-implemented method of any one of embodiments 1-13,
wherein a milling angle between a milling axis of the slanted milling and a wafer surface of the wafer (511) is in the range between 8° and 45°.

Embodiment 15

A computer program including program code that can be loaded an executed by a processor, wherein the processor, upon loading and executing the program code executes a method including:
obtaining one or more images (1001, 1002, 1003) of a test volume (510) of a wafer (511) mounted on a sample stage (515) of a dual-beam device (500), the one or more images (1001, 1002, 1003) being acquired using an imaging column (540) of the dual-beam device (500) and depicting one or more cross-sections (552, 553, 554) of the test volume (510) at one or more stage tilts of the sample stage (515) and obtained by slanted milling of the wafer (511) using a milling column of the dual-beam device (500), and
by taking into account prior knowledge of one or more structures (511A, 552A, 1001, 1002, 1003, 1011, 1012) of the wafer (511) and based on the one or more images (1001, 1002, 1003), determining at least one component of a wafer tilt (120) of the wafer (511) with respect to the sample stage (515).

What is claimed is:

1. A method of operating a dual-beam device which comprises an imaging column, a particle detector and a milling column, the method comprising:
   capturing at least one image of a test volume of a wafer mounted on a sample stage of the dual-beam device by operating the imaging column and the particle detector, the image depicting at least one cross-section of the test volume at at least one stage tilt of the sample stage, the at least one cross-section of the test volume obtained by slanted milling of the wafer using the milling column of the dual-beam device; and
   determining at least one component of a wafer tilt of the wafer with respect to the sample stage taking into account knowledge of at least one structure of the wafer and the at least one image of the test volume of the wafer.

2. The method of claim 1, wherein:
   the at least one structure of the wafer comprises at least one semiconductor device structure of the wafer; and
   the knowledge of the at least one structure of the wafer comprises a size of the at least one semiconductor device structure.

3. The method of claim 2, wherein:
   the size of the at least one semiconductor device structure comprises a depth offset between multiple layers of the semiconductor device; and
   determining the at least one component of the wafer tilt comprises taking into account an imaged distance between the multiple layers of the semiconductor device in each image and taking into account the depth offset between the multiple layers of the semiconductor device.

4. The method of claim 3, further comprising:
   determining two orthogonal imaged distances between the multiple layers of the semiconductor device in each image; and
   determining two orthogonal components of the wafer tilt by taking into account the two orthogonal imaged distances between the multiple layers of the semiconductor device layers in each image.

5. The method of claim 1, wherein the at least one structure comprises at least one layer of the wafer, and the knowledge of the at least one structure of the wafer comprises a planarity of the at least one layer.

6. The method of claim 5, wherein:
   the at least one image comprises multiple images depicting a single cross-section of the test volume at multiple stage tilts of the sample stage; and
   the method further comprises, for each one of the multiple images:
      detecting at least one edge of the at least one layer of the wafer in a respective image; and
      determining at least one component of the wafer tilt of the wafer taking into account a change of an appearance of the at least one edge between the multiple images and prior knowledge of the multiple stage tilts.

7. The method of claim 6, wherein:
   the at least one layer comprises multiple layers; and
   the method further comprises for each one of the multiple images:
      determining an imaged distance between adjacent edges of different ones of the multiple layers in the respective image; and
      determining the at least one component of the wafer tilt by taking into account the change of the imaged distance between the multiple images.

8. The method of claim 7, further comprising, for each one of the multiple images:
   determining two orthogonal imaged distances between adjacent edges of different ones of the multiple layers in the respective image; and
   determining two orthogonal components of the wafer tilt by taking into account the change of each one of the two orthogonal imaged distances between the multiple images.

9. The method of claim 6, further comprising, for each one of the multiple images:
   determining an image orientation of the at least one edge; and
   determining the wafer tilt taking into account the change of the image orientation between the multiple images.

10. The method of claim 6, wherein the at least one edge comprises a cutting edge of a slanted milling with respect to a top surface of the wafer.

11. The method of claim 6, wherein the at least one edge comprises a cross-sectional edge of a slanted milling with respect to a semiconductor device layer of the wafer.

12. The method of claim 5, wherein:
   the at least one image comprises multiple images depicting multiple cross-sections obtained by the slanted milling at multiple milling depths and a single stage tilt; and
   the method further comprises:
      determining at least one offset between imaged positions of the at least one layer between the multiple images; and
      determining the at least one component of the wafer tilt taking into account prior knowledge of the multiple milling depths and the at least one offset.

13. The method of claim 12, further comprising:
   obtaining at least one image for a first rotation of the sample stage with respect to the imaging column;
   obtaining multiple further images of the test volume of the wafer mounted on the sample stage of the dual-beam device, the multiple further images being acquired using the imaging column and the particle detector, the multiple further images depicting multiple further cross sections of the test volume obtained by slanted milling at multiple further milling depths using the milling column, the multiple further images being obtained for a second rotation of the sample stage with respect to the imaging column, the first rotation being different from the second rotation;
   determining at least one further offset between a further imaged position of the at least one layer of the wafer between the multiple further images; and
   taking into account prior knowledge of the multiple further milling depths and the at least one further offset, determining a further component of the wafer tilt.

14. The method of claim 1, wherein a milling angle between a milling axis of the slanted milling and a surface of the wafer is between 8° and 45°.

15. The method of claim 1, further comprising:
   controlling the imaging column and the particle detector to capture the at least one image of the test volume of the wafer; and
   determining the at least one component of the wafer tilt of the wafer by operating a computer.

16. The method of claim 1, further comprising reconstructing 3-D tomographic images of the test volume of the wafer taking into account the at least one component of the wafer tilt.

17. The method of claim 1, further comprising changing the at least one stage tilt of the sample stage to compensate the determined at least one component of the wafer tilt.

18. The method of claim 1, wherein:
the test volume of the wafer comprises at least one semiconductor device structure; and
the method further comprises determining, based on the determined at least one component of the wafer tilt, at least one member selected from the group consisting of (i) a tilt of the at least one semiconductor device structure with respect to a normal vector of the wafer, (ii) a three-dimensional shape of the at least one semiconductor device structure, or (iii) an orientation of the at least one semiconductor device structure in three dimensions.

19. The method of claim 18, wherein the at least one semiconductor device structure comprise at least one vertical memory channel of a three-dimensional memory structure.

20. The method of claim 1, wherein capturing the at least one image of the test volume of the wafer mounted on the sample stage of the dual-beam device by operating the imaging column and the particle detector comprises:
scanning a cross-section of a surface of the wafer with a beam of charged particles emitted by the imaging column, thereby generating secondary particles; and
collecting at least some of the secondary particles with the particle detector.

21. One or more machine-readable hardware storage devices comprising machine-executable instructions that when executed by one or more processing devices cause a dual-beam device comprising an imaging column and a particle detector to perform operations comprising:
operating the imaging column and the particle detector to capture at least one image of a test volume of a wafer mounted on a sample stage of the dual-beam device, the image depicting at least one cross-section of the test volume at at least one stage tilt of the sample stage, the at least one cross-section of the test volume obtained by slanted milling of the wafer using the milling column of the dual-beam device; and
determining at least one component of a wafer tilt of the wafer with respect to the sample stage taking into account knowledge of at least one structure of the wafer and the at least one image of the test volume of the wafer.

22. A system comprising:
one or more processing devices; and
one or more machine-readable hardware storage devices comprising machine-executable instructions that, when executed by the one or more processing devices, cause a dual-beam device comprising an imaging column and a particle detector to perform operations comprising:
operating the imaging column and the particle detector to capture at least one image of a test volume of a wafer mounted on a sample stage of the dual-beam device, the image depicting at least one cross-section of the test volume at at least one stage tilt of the sample stage, the at least one cross-section of the test volume obtained by slanted milling of the wafer using the milling column of the dual-beam device; and
determining at least one component of a wafer tilt of the wafer with respect to the sample stage taking into account knowledge of at least one structure of the wafer and the at least one image of the test volume of the wafer.

23. The system of claim 22, further comprising the dual-beam device.

24. A method of operating a dual-beam device which comprises an imaging column, a particle detector and a milling column, the method comprising:
operating the milling column to slant mill a test volume of a wafer to yield a cross-section of the test volume;
operating the imaging column and the particle column to capture an image of the cross-section of the test volume of the wafer; and
determining a component of a wafer tilt of the wafer with respect to a sample stage of the dual-beam device taking into account knowledge of a structure of the wafer and the image of the test volume of the wafer.

25. The method of claim 24, further comprising operating a computer to control the method.

* * * * *

UNITED STATES PATENT AND TRADEMARK OFFICE
CERTIFICATE OF CORRECTION

Page 1 of 1

PATENT NO. : 12,056,865 B2
APPLICATION NO. : 17/496345
DATED : August 6, 2024
INVENTOR(S) : Dmitry Klochkov, Chuong Huynh and Thomas Korb It is certified that error appears in the above-identified patent and that said Letters Patent is hereby corrected as shown below:

In the Specification

Column 5, Line 33, after "1011" insert -- . --.

Column 13, Line 36, after "images" delete "is".

Signed and Sealed this
Twenty-fourth Day of September, 2024

Katherine Kelly Vidal
*Director of the United States Patent and Trademark Office*